(12) United States Patent
Kuo

(10) Patent No.: US 11,036,070 B2
(45) Date of Patent: Jun. 15, 2021

(54) CURVED DISPLAY DEVICE AND MANUFACTURING METHOD THEREFOR

(71) Applicant: PEGATRON CORPORATION, Taipei (TW)

(72) Inventor: Yu-Feng Kuo, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/250,705

(22) Filed: Jan. 17, 2019

(65) Prior Publication Data

US 2019/0317356 A1     Oct. 17, 2019

(30) Foreign Application Priority Data

Apr. 11, 2018  (TW) ................................ 107112373

(51) Int. Cl.
| | | |
|---|---|---|
| *G02F 1/1333* | (2006.01) | |
| *H01L 51/00* | (2006.01) | |
| *H01L 51/52* | (2006.01) | |
| *H01L 51/56* | (2006.01) | |

(52) U.S. Cl.
CPC .. *G02F 1/133305* (2013.01); *G02F 1/133308* (2013.01); *G02F 1/133322* (2021.01); *H01L 51/0097* (2013.01); *H01L 51/5237* (2013.01); *H01L 51/56* (2013.01)

(58) Field of Classification Search
CPC ........ G02F 1/133305; G02F 1/133308; G02F 2001/133322
See application file for complete search history.

(56) References Cited

U.S. PATENT DOCUMENTS

| | | | | |
|---|---|---|---|---|
| 9,880,398 B2 * | 1/2018 | De Sio | ............ | G02F 1/133711 |
| 10,036,834 B2 | 7/2018 | Su et al. | | |
| 2009/0174832 A1 * | 7/2009 | Lee | ........ | G06F 3/0412 |
| | | | | 349/43 |
| 2009/0207359 A1 * | 8/2009 | Shin | ............ | G02F 1/133707 |
| | | | | 349/129 |
| 2013/0329149 A1 * | 12/2013 | Jang | ........ | C09K 19/56 |
| | | | | 349/41 |

(Continued)

FOREIGN PATENT DOCUMENTS

| | | |
|---|---|---|
| CN | 104464523 | 3/2015 |
| CN | 105572930 | 5/2016 |

(Continued)

OTHER PUBLICATIONS

"Search Report of Europe Counterpart Application", dated May 7, 2019, p. 1-p. 7.

*Primary Examiner* — Dung T Nguyen
(74) *Attorney, Agent, or Firm* — J.C. Patents

(57) ABSTRACT

A curved display device includes a flat panel display, a curved protective layer, and a photo-alignment layer. The flat panel display has a display surface. The curved protective layer is arranged on one side of the display surface of the flat panel display. The photo-alignment layer is arranged between the flat panel display and the curved protective layer, where the photo-alignment layer includes a plurality of photo-alignment units. The greater distances between the photo-alignment units and a center of the flat panel display, the smaller angles formed between the photo-alignment units and the display surface.

9 Claims, 6 Drawing Sheets

(56) References Cited

U.S. PATENT DOCUMENTS

| | | | |
|---|---|---|---|
| 2015/0138484 A1* | 5/2015 | Watanabe | G02F 1/133308 |
| | | | 349/58 |
| 2015/0351272 A1 | 12/2015 | Wilder et al. | |
| 2016/0195646 A1* | 7/2016 | Su | G02B 3/0087 |
| | | | 362/97.1 |
| 2016/0231607 A1* | 8/2016 | Wu | G02F 1/133514 |
| 2017/0059917 A1 | 3/2017 | Kao et al. | |
| 2018/0107012 A1 | 4/2018 | Xu et al. | |
| 2018/0113370 A1 | 4/2018 | Zhao et al. | |

FOREIGN PATENT DOCUMENTS

| | | |
|---|---|---|
| CN | 105629622 | 6/2016 |
| JP | H095745 | 1/1997 |
| JP | 2000250432 | 9/2000 |
| JP | 5237437 | 7/2013 |
| JP | 2016210075 | 12/2016 |
| JP | 2017194674 | 10/2017 |
| TW | 201204761 | 2/2012 |
| WO | 2016074917 | 5/2016 |
| WO | 2017173792 | 10/2017 |
| WO | 2018146953 | 8/2018 |

* cited by examiner

CURVED DISPLAY DEVICE AND MANUFACTURING METHOD THEREFOR

CROSS-REFERENCE TO RELATED APPLICATION

This application claims the priority benefit of Taiwan application serial no. 107112373, filed on Apr. 11, 2018. The entirety of the above-mentioned patent application is hereby incorporated by reference herein and made a part of this specification.

BACKGROUND

Technical Field

The present invention relates to a display device and a manufacturing method therefor, and in particular, to a curved display device and a manufacturing method therefor.

Related Art

In recent years, various consumer electronic products have changed from functional to artistic development based on design, novelty and fashion. Therefore, the industry has developed a curved display, and appearance needs therefor can be achieved by adjusting a curvature of the display. If used in a vehicle, the curved display can enable a streamlined shape to be fully shown in the vehicle body, and glare reflection of a flat panel display can be reduced.

However, there are still many problems in designing and manufacturing a curved surface of the display. In detail, a hyperboloid lamination process used in a curved display is not mature yet, and in assembly, a curved backlight module is difficult to design and assemble. In addition, a bending direction of the curved display is limited by a position of an internal electronic element, and a display element needs to be further processed for a thinning process, resulting in a decrease in an overall yield. To improve the yield and reduce costs, a flat panel display can be designed in combination with a curved protective layer. However, when an observer views a curved display device, because an edge of the curved display device is curved, but actually the entire display is flat, the observer usually feels a picture deformation. Therefore, how to design a curved display with low costs, a high yield, a simple process and a better display effect is an important issue in the art.

SUMMARY

The present invention provides a curved display device and a manufacturing method therefor, which can reduce manufacturing costs and manufacturing difficulties, and have a better manufacturing yield and display effect.

An embodiment of the present invention provides a curved display device, including a flat panel display, a curved protective layer, and a photo-alignment layer. The flat panel display has a display surface. The curved protective layer covers one side of the display surface of the flat panel display. The photo-alignment layer is arranged between the flat panel display and the curved protective layer, where the photo-alignment layer includes a plurality of photo-alignment units and the photo-alignment units each have an arrangement direction. The greater distances between the photo-alignment units and a center of the flat panel display, the smaller angles formed between the arrangement directions of the photo-alignment units and the display surface.

In an embodiment of the present invention, the foregoing photo-alignment layer is formed by mixing the plurality of photo-alignment units with a hydrogel.

In an embodiment of the present invention, a material of the foregoing curved protective layer is glass, ceramic, or plastic.

In an embodiment of the present invention, the foregoing photo-alignment units are high molecular particles, liquid crystal molecules, or polyimides.

In an embodiment of the present invention, a refractive index of the foregoing photo-alignment layer approximates a refractive index of the curved protective layer.

Another embodiment of the present invention provides a manufacturing method for a curved display device, the method including: providing a flat panel display and a hybrid hydrogel, where the hybrid hydrogel includes a plurality of photo-alignment units; arranging the hybrid hydrogel to a display surface of the flat panel display; covering the flat panel display with a curved protective layer, where the hybrid hydrogel is located between the flat panel display and the curved protective layer; adjusting arrangement directions of the photo-alignment units according to positions of the photo-alignment units; and curing the hybrid hydrogel to form a photo-alignment layer to complete the curved display device, where the greater distances between the positions of the photo-alignment units and a center of the flat panel display, the smaller angles formed between the arrangement direction of the photo-alignment units and the display surface.

In an embodiment of the present invention, the foregoing hybrid hydrogel is formed by mixing the photo-alignment units with a hydrogel.

In an embodiment of the present invention, the foregoing manufacturing method further includes a step of manufacturing the curved protective layer in a hot or cold bending manner.

In an embodiment of the present invention, the foregoing manufacturing method further includes a step of manufacturing the curved protective layer by using a sol-gel method.

In an embodiment of the present invention, the foregoing hybrid hydrogel is arranged at a center to an edge position of the display surface, and the step of adjusting arrangement directions of the photo-alignment units according to positions of the photo-alignment units includes: shielding at least one part of the hybrid hydrogel located in a central area of the display surface; and adjusting at least another part of the hybrid hydrogel located in an edge area of the display surface.

In an embodiment of the present invention, the foregoing step of adjusting arrangement direction of the photo-alignment units according to positions of the photo-alignment units is to irradiate at least one part of the hybrid hydrogel with ultraviolet polarized light to adjust the arrangement directions of the photo-alignment units.

Based on the foregoing, in the present invention, the curved display device uses the flat panel display, and an emitted light beam can change a transmission direction based on the arrangement directions of the plurality of photo-alignment units arranged in the photo-alignment layer of the flat panel display, and then can be transmitted to the human eye in a forward direction of a viewing angle, so that costs of the curved display device are reduced, a manufacturing process is simple, a yield is high, and a better display effect can be achieved.

To make the foregoing characteristics and advantages of the present invention more comprehensible, embodiments are further described below in detail with reference to accompanying drawings.

DETAILED DESCRIPTION

Figure 1:
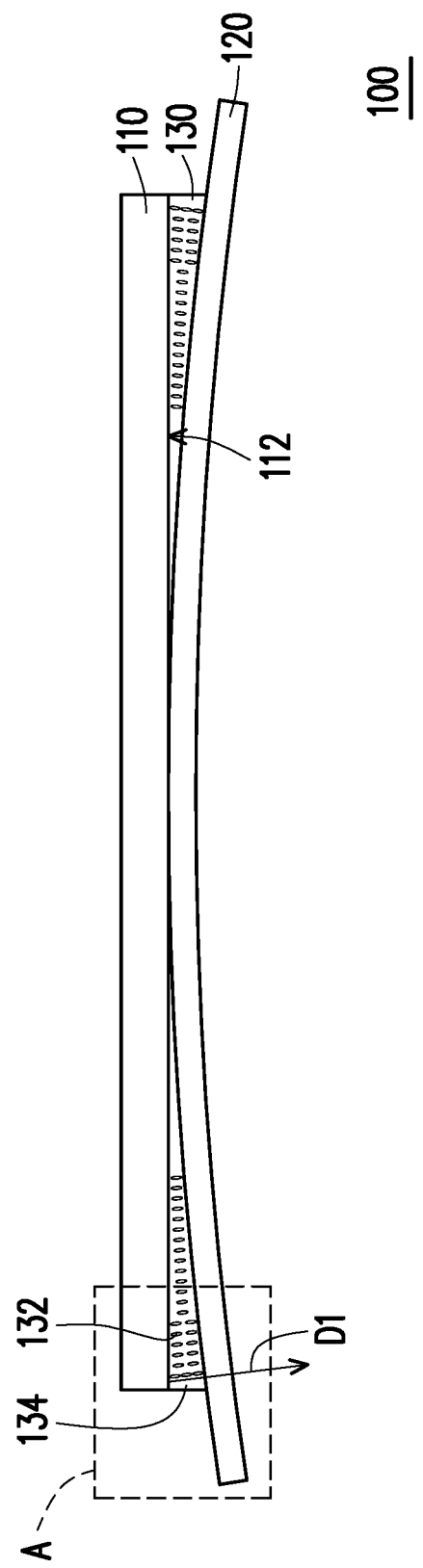
FIG. 1 is a schematic cross-sectional view of a curved display device according to an embodiment of the present invention.

FIG. 1 is a schematic cross-sectional view of a curved display device according to an embodiment of the present invention. Referring to FIG. 1, in this embodiment, the curved display device 100 includes a flat panel display 110, a curved protective layer 120, and a photo-alignment layer 130. The flat panel display 110 has a display surface 112. The curved protective layer 120 is arranged on one side of the display surface 112 of the flat panel display 110. Specifically, the curved protective layer 120 covers the display surface 112 of the flat panel display 110. The photo-alignment layer 130 is arranged between the flat panel display 110 and the curved protective layer 120. Therefore, a light beam emitted by the flat panel display 110 is emitted from the display surface 112 and then sequentially transmitted through the photo-alignment layer 130 and the curved protective layer 120, and is emitted as an image light beam from one side of the curved protective layer 120 relative to the flat panel display 110. The curved display device 100 in this embodiment is used, for example, in an automobile instrument panel, but the present invention is not limited thereto.

In this embodiment, the flat panel display 110 is, for example, a thin film transistor-liquid crystal display (TFT-LCD), an organic light-emitting diode (OLED) display, or other suitable types of displays, and the present invention is not limited thereto.

In an embodiment of the present invention, a material of the foregoing curved protective layer 120 is glass, ceramic, or plastic. For example, the curved protective layer 120 is, for example, a glass cover, a quartz cover, a sapphire cover, a ceramics cover, or a plastic cover, the cover may be formed by using a sol-gel method, and the present invention is not limited thereto.

In this embodiment, the photo-alignment layer 130 includes a plurality of photo-alignment units 132. Materials of the photo-alignment units 132 are, for example, high molecular particles, liquid crystal molecules, or polyimides, but the present invention is not limited thereto. Specifically, in this embodiment, the photo-alignment layer 130 further includes a hydrogel 134. In other words, the photo-alignment layer 130 is formed by mixing the plurality of photo-alignment units 132 with the hydrogel 134. Because the photo-alignment layer 130 has the plurality of photo-alignment units 132, the light beam emitted from the display surface 112 can change a transmission path by using the photo-alignment units 132. In detail, the photo-alignment units 132 each have an arrangement direction D1, and the light beam is transmitted according to the arrangement directions D1 of the photo-alignment units 132. In this embodiment, a refractive index of the photo-alignment layer 130 approximates that of the curved protective layer 120. Therefore, in a manufacturing process, an adjustment range of the photo-alignment units 132 can be reduced and a manufacturing yield and optical quality can be improved, but the present invention is not limited thereto.

Figure 2A:
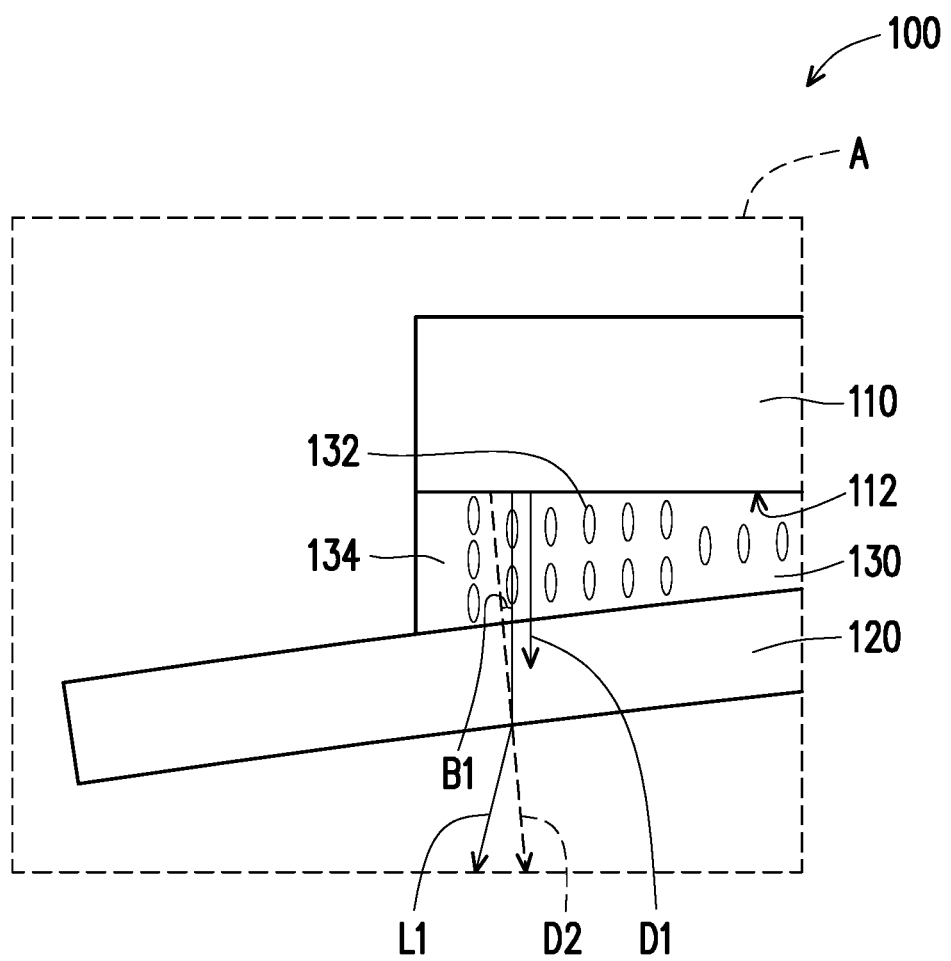
FIG. 2A and FIG. 2B are respectively partially enlarged schematic views of photo-alignment units in an area A of FIG. 1 before and after direction adjustment.
Figure 2B:
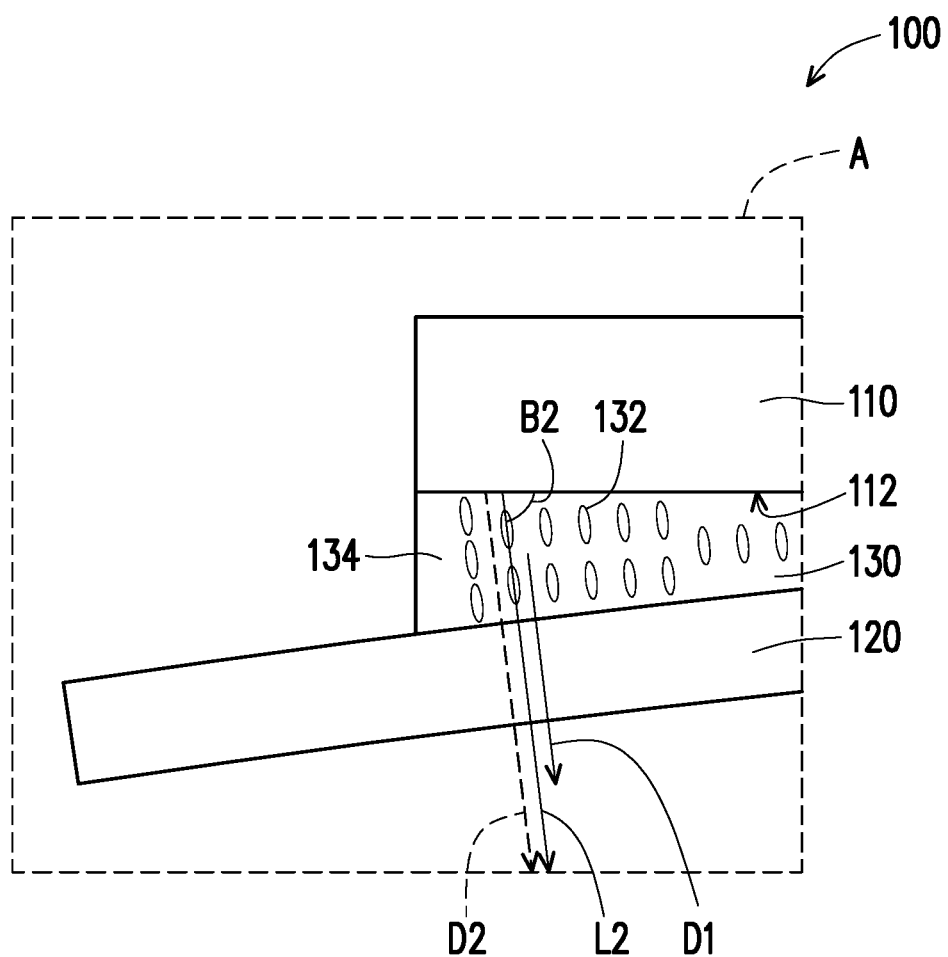
Figure 3A:
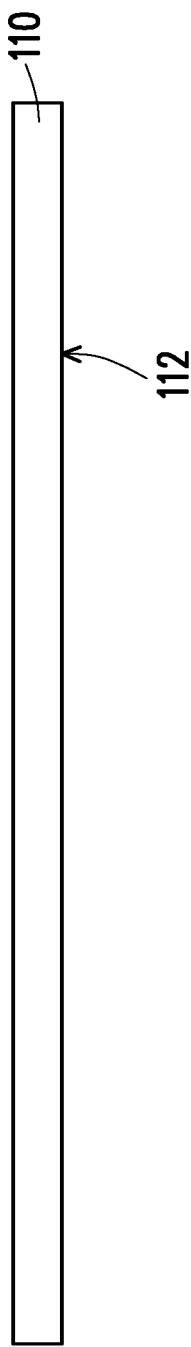
FIG. 3A to FIG. 3D are schematic diagrams showing a manufacturing process of the curved display device of FIG. 1.
Figure 3B:
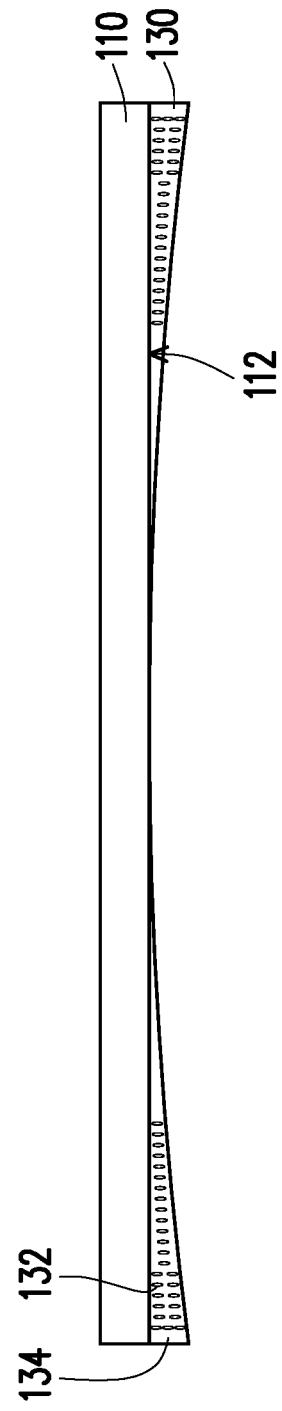
Figure 3C:
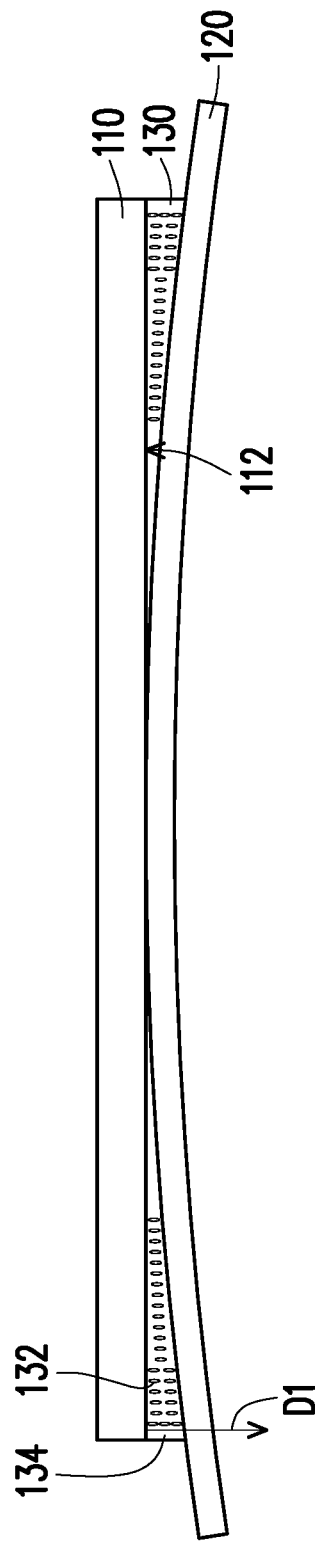
Figure 3D:
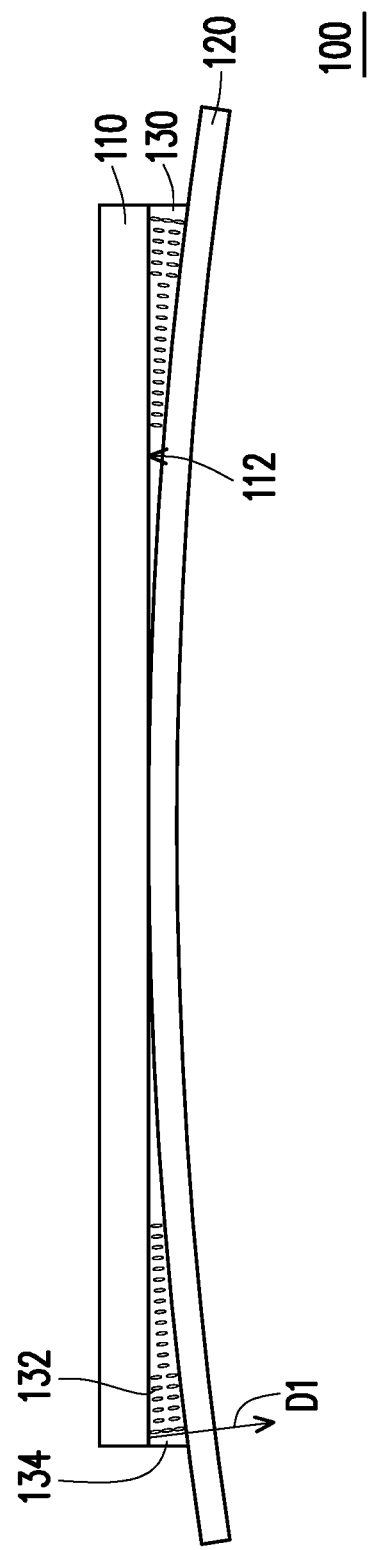

FIG. 2A and FIG. 2B are respectively partially enlarged schematic views of photo-alignment units in an area A of FIG. 1 before and after direction adjustment. Referring to FIG. 1 to FIG. 2B together, in this embodiment, before the arrangement directions D1 of the photo-alignment units 132 are adjusted, the light beam L1 emitted from the display surface 112 is transmitted through the photo-alignment layer 130 according to the arrangement directions D1 of the photo-alignment units 132. There is an angle B1 between the transmission direction and a preset direction D2, and the angle B1 increases as a distance from a center of the flat panel display 110 increases. The preset direction D2 refers to an optimal transmission direction of the image light beam toward a user. Therefore, in the curved display device, the preset direction D2 at each position is different. In detail, the curved display device 100 of this embodiment has a large deviation in the preset direction D2 at a position with a larger distance from a center of the curved display device 100. In other words, when the angle B1 is greater than 0, the light beam L1 cannot be transmitted to the human eye in a forward direction of a viewing angle, and an image acquired by the human eye is deformed or affects viewing comfort, as shown in FIG. 2A.

In this embodiment, after directions of the photo-alignment units 132 are adjusted, a light beam L2 emitted from the display surface 112 is transmitted through the photo-alignment layer 130 according to the arrangement directions D1 of the photo-alignment units 132. Therefore, the light beam L2 at each position is transmitted to the human eye in the preset direction D2, as shown in FIG. 2B. In other words, the greater distances between the photo-alignment units 132 and a center of the flat panel display 110, the smaller angles B2 formed between the arrangement directions D1 of the photo-alignment units 132 and the display surface 112. In this way, because each photo-alignment unit 132 is optically tuned, the light beam L2 emitted from different positions in the flat panel display 110 can be transmitted to the human eye along the arrangement directions D1 of the corresponding photo-alignment units 132 in the forward direction of the viewing angle, so that the curved display device 100 achieves a better display effect.

For example, in an embodiment of the present invention, the length of the flat panel display 110 is 216.96 mm. Therefore, a distance from the center to an edge of the flat panel display 110 is 108.48 mm. A curvature radius of the curved protective layer is 1800 mm. Therefore, an angle between the preset direction D2 at the edge of the flat panel display 110 and the display surface 112 of the flat panel display 110 is in accordance with $\tan^{-1}(108.48/1800) = 3.4489$ degrees. In other words, when the arrangement directions D1 of the photo-alignment units 132 corresponding to the edge of the flat panel display 110 are adjusted to the foregoing angle, the light beam emitted at this position can be transmitted to the human eye in the forward direction.

Figure 4:
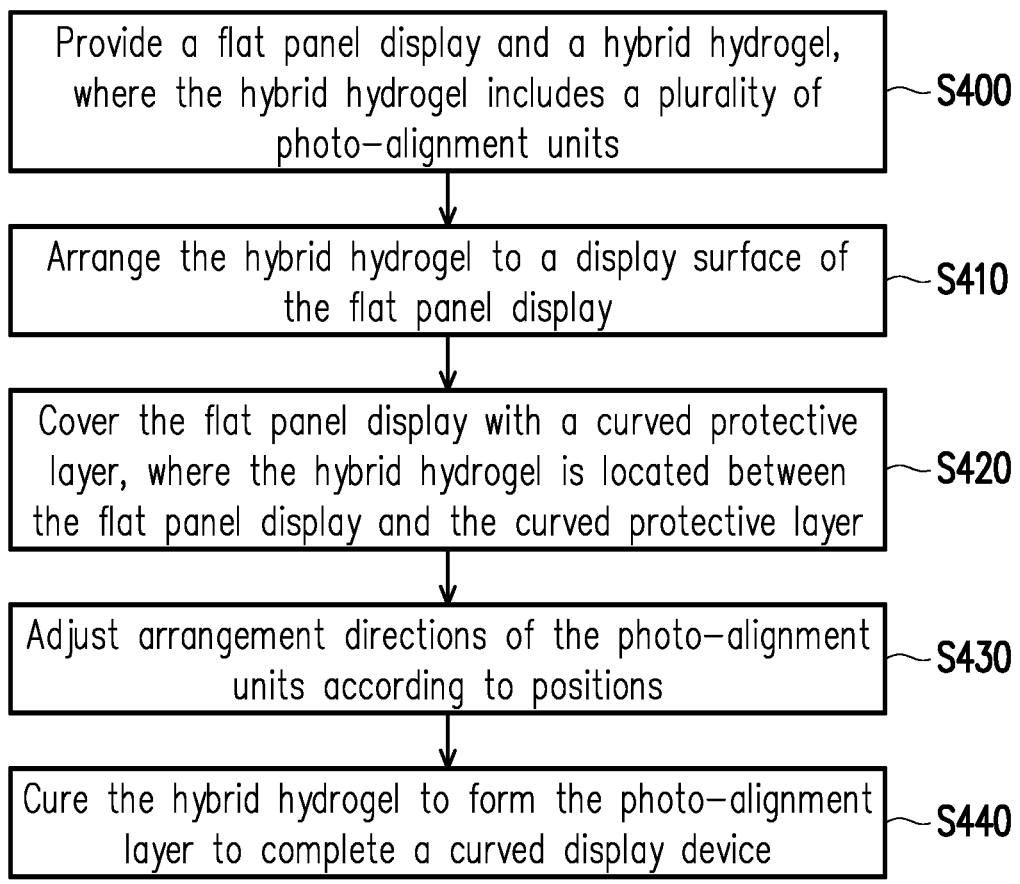
FIG. 4 is a flowchart of a manufacturing method for a curved display device according to an embodiment of the present invention.

FIG. 3A to FIG. 3D are schematic diagrams showing a manufacturing process of the curved display device of FIG. 1. FIG. 4 is a flowchart of a manufacturing method for a curved display device according to an embodiment of the present invention. Referring to FIG. 1, FIG. 3A to FIG. 3D, and FIG. 4 together, the manufacturing method for the curved display device of FIG. 4 can be applied to at least the curved display device 100 of FIG. 1, but the present invention is not limited thereto. In this embodiment, step S400 is first performed to provide the flat panel display 110 and a hybrid hydrogel (that is, an uncured photo-alignment layer 130), where the hybrid hydrogel includes the plurality of photo-alignment units 132. Specifically, in this step, the plurality of photo-alignment units 132 are mixed with the hydrogel 134 to form the hybrid hydrogel, and the photo-alignment units 132 are uniformly distributed in the hydrogel 134.

Next, step S410 is performed to arrange the hybrid hydrogel to the display surface 112 of the flat panel display 110. In this case, the hybrid hydrogel is not completely cured.

Next, step S420 is performed to cover the flat panel display 110 with the curved protective layer 120, and the hybrid hydrogel is located between the flat panel display 110 and the curved protective layer 120. In this embodiment, a step of manufacturing the curved protective layer 120 in a hot or cold bending manner may further be included, and the curved protective layer 120 may be formed by using the sol-gel method, but the present invention is not limited thereto.

Next, step S430 is performed to adjust the arrangement directions D1 of the photo-alignment units 132 according to positions of the photo-alignment units. Specifically, in this embodiment, the hybrid hydrogel is arranged at a center to an edge position of the display surface 112, and the step of adjusting the arrangement directions D1 of the photo-alignment units 132 according to positions of the photo-alignment units further includes: shielding at least one part of the hybrid hydrogel located in a central area of the display surface 112; and adjusting at least another part of the hybrid hydrogel located in an edge area of the display surface 112. In detail, in this embodiment, for the arrangement directions D1 of the photo-alignment units 132, for example, at least one part of the hybrid hydrogel is irradiated with ultraviolet polarized light to adjust the arrangement directions D1 of the corresponding photo-alignment units 132. Therefore, during the adjustment, a shielding piece is used to shield an adjacent part of the hybrid hydrogel to be adjusted, and then the adjustment is performed through irradiation with the ultraviolet polarized light. After arrangement directions D1 of some photo-alignment units 132 are adjusted, a position shielded by the shielding piece is replaced to adjust an arrangement direction D1 of a next photo-alignment unit 132. In this way, the display quality of the curved display device 100 can be improved through a plurality of adjustments with the ultraviolet polarized light.

The greater distances between the photo-alignment units 132 adjusted in step S430 and the center of the flat panel display 110, the smaller angles formed between the arrangement directions D1 of the photo-alignment units 132 and the display surface 112. Finally, step S440 is performed to cure the hybrid hydrogel to form the photo-alignment layer 130 to complete the curved display device. The hybrid hydrogel can be cured through heating or curing at normal temperature, and the present invention is not limited thereto.

In conclusion, the curved display device of the present invention uses the flat panel display, and an emitted light beam can change a transmission direction based on the arrangement directions of the plurality of photo-alignment units arranged in the photo-alignment layer of the flat panel display, and then can be transmitted to the human eye in the forward direction of the viewing angle, so that costs of the curved display device are reduced, the manufacturing process is simple, the yield is high, and the better display effect can be achieved.

Although the present invention is disclosed above by using the embodiments, the embodiments are not intended to limit the present invention. Any person of ordinary skill in the art can make various variations and modifications without departing from the spirit and the scope of the present invention. Therefore, the protection scope of the present invention shall be subject to the appended claims.

What is claimed is:

1. A curved display device, comprising:
   a flat panel display, having a display surface;
   a curved protective layer, covering the display surface of the flat panel display; and
   a photo-alignment layer, arranged between the flat panel display and the curved protective layer, wherein the photo-alignment layer is a cured structure layer of a hybrid hydrogel comprising a plurality of photo-alignment units mixed with a hydrogel, the photo-alignment units each have an arrangement direction, and the greater distances between positions of the photo-alignment units and a center of the flat panel display, the smaller angles formed between the arrangement directions of the photo-alignment units and the display surface, wherein a refractive index of the photo-alignment layer approximates a refractive index of the curved protective layer.

2. The curved display device according to claim 1, wherein a material of the curved protective layer is glass, ceramic, or plastic.

3. The curved display device according to claim 1, wherein the photo-alignment units are high molecular particles, liquid crystal molecules, or polyimides.

4. A manufacturing method for a curved display device, the method comprising:
   providing a flat panel display and a hybrid hydrogel, wherein the hybrid hydrogel comprises a plurality of photo-alignment units;
   arranging the hybrid hydrogel to a display surface of the flat panel display;
   covering the flat panel display with a curved protective layer, wherein the hybrid hydrogel is located between the flat panel display and the curved protective layer;
   adjusting arrangement directions of the photo-alignment units according to positions of the photo-alignment units; and
   curing the hybrid hydrogel to form a photo-alignment layer to complete the curved display device, wherein the greater distances between the positions of the photo-alignment units and a center of the flat panel display, the smaller angles formed between the arrangement directions of the photo-alignment units and the display surface.

5. The manufacturing method according to claim 4, wherein the hybrid hydrogel is formed by mixing the photo-alignment units with a hydrogel.

6. The manufacturing method according to claim 4, further comprising a step of manufacturing the curved protective layer in a hot or cold bending manner.

7. The manufacturing method according to claim 4, further comprising a step of manufacturing the curved protective layer by using a sol-gel method.

8. The manufacturing method according to claim 4, wherein the hybrid hydrogel is arranged at a center to an edge position of the display surface, and the step of adjusting arrangement directions of the photo-alignment units according to positions of the photo-alignment units comprises:
  shielding at least one part of the hybrid hydrogel located in a central area of the display surface; and
  adjusting at least another part of the hybrid hydrogel located in an edge area of the display surface.

9. The manufacturing method according to claim 4, wherein the step of adjusting arrangement directions of the photo-alignment units according to positions of the photo-alignment units is to irradiate at least one part of the hybrid hydrogel with ultraviolet polarized light to adjust the arrangement directions of the photo-alignment units.

\* \* \* \* \*